United States Patent [19]

Woolf

[11] Patent Number: 4,623,862

[45] Date of Patent: Nov. 18, 1986

[54] THERMALLY STABILIZED SUPERCONDUCTORS

[75] Inventor: Lawrence D. Woolf, Carlsbad, Calif.

[73] Assignee: GA Technologies Inc., San Diego, Calif.

[21] Appl. No.: 686,981

[22] Filed: Dec. 27, 1984

[51] Int. Cl.$^4$ .............................................. H01F 7/22
[52] U.S. Cl. ................................ 335/216; 174/126 S
[58] Field of Search .................... 335/216; 174/126 S, 174/128 S; 336/DIG. 1; 29/599

[56] References Cited

U.S. PATENT DOCUMENTS

| | | | |
|---|---|---|---|
| 3,109,745 | 11/1963 | Begany et al. | 117/5.3 |
| 3,766,502 | 10/1973 | Bronca et al. | 335/216 |
| 3,983,521 | 9/1976 | Furuto et al. | 335/216 |
| 4,171,464 | 10/1979 | Steyert, Jr. | 174/126 |
| 4,190,817 | 2/1980 | Rabinowitz | 335/216 |
| 4,195,199 | 3/1980 | Hillmann et al. | 335/216 |

FOREIGN PATENT DOCUMENTS 55-62708 11/1978 Japan .................................. 335/216

*Primary Examiner*—George Harris
*Attorney, Agent, or Firm*—Fitch, Even, Tabin & Flannery

[57] ABSTRACT

Heavy fermion materials are used for thermally stabilizing systems which operate below about 10° K., particularly superconducting systems. These materials have extremely high heat capacities below 10° K., and furthermore, their heat capacities are substantially unaffected by magnetic field intensity, making them especially useful for thermally stabilizing superconducting magnet windings. In a particular application, a superconductor includes superconducting filaments surrounded by a metal stabilizer and heavy fermion material is incorporated in insolubilized form in the stabilizer.

20 Claims, 8 Drawing Figures

THERMALLY STABILIZED SUPERCONDUCTORS

The present invention relates generally to superconducting magnet circuitry and more specifically to the use of heavy fermion superconductive material for thermally stabilizing superconducting windings.

BACKGROUND OF THE INVENTION

In superconducting magnets, variations in magnetic fields and temperature are common occurrences which often cause conduction faults in superconducting filaments. To compensate for such conducting faults, the magnetic windings are usually formed of wires in which the superconducting filaments are encased in a metal, such as silver, copper or aluminum, which is normally conductive across a wide range of temperatures, including superconducting temperatures. The metal electrically stabilizes the wire by shunting any portion of the filament(s) which has become non-superconducting. Furthermore, the encasing metal has good thermal conductivity, tending to transfer heat away from hot spots in the windings. Nevertheless, events, such as flux jumps, wire motion or eddy currents, in the superconducting filaments or encasing metal produce heat which may lead to a precipitous normalization of superconductive windings. Such temperature excursions occur during periods measured in microseconds, such short periods being insufficient for dissipation of the heat to the coolant, e.g., liquid helium.

To reduce the probability of normalizing temperature excursions, U.S. Pat. No. 4,171,464 proposes that particles or fibers of gadolinium oxide or gadolinium-aluminum oxide be incorporated in the metal, e.g., copper, that encases the superconducting filaments. These materials have high heat capacities at superconducting temperatures, e.g., below about 5° K., and thus tend to absorb substantial amounts of locally produced heat. Furthermore, these materials undergo antiferromagnetic transitions within the superconducting temperature range, and when a decrease in the magnetic field occurs as a result of a conduction fault, the specific heat of the material increases, enhancing the adiabatic stabilization.

However, adiabatic thermal stabilization through adiabatic demagnetization by compositions, such as the gadolinium and gadolinium-aluminum oxides which undergo antiferromagnetic transitions, is only realized if the effective magnetic field experienced by the material decreases. Thus, the material is less efficient in preventing precipitous normalizations in circumstances where a localized normalization of the superconducting filaments occurs but does not produce an immediate change in the magnetic fields to which the thermal stabilizer is subjected.

Furthermore, because the magnetically affected contributions to heat capacity of materials, such as gadolinium oxides, are a substantial portion of the total heat capacity and because these components of their total heat capacity decrease with increasing magnetic field, these materials are less useful for thermal stabilization in superconducting applications where very intense magnetic fields are produced. As noted in the above-mentioned '464 patent, $Gd_2O_3$ has substantially less heat capacity in a 2.4 Tesla (Tesla = 10,000 Gauss) field than in a 0 Tesla field. Many present day superconducting magnet applications require substantially higher magnetic fields; for example, at the present time, superconducting magnets for fusion applications may produce magnetic fields in the range of 15 Tesla. At such magnetic field intensities, the heat capacities of materials, such as $Gd_2O_3$, having large magnetic field-affected components of heat capacity, will be severely depressed.

There is a need for materials for use in superconducting applications which have high heat capacities and which are substantially unaffected by the magnetic field.

SUMMARY OF THE INVENTION

Heavy fermion materials have extremely high heat capacities at temperatures below about 10° K., and in accordance with the present invention, these materials are used to absorb heat in low temperature applications; for example, these materials may be dispersed in a stabilizing shunt material, such as silver, copper or aluminum, which surrounds and electrically stabilizes superconducting filaments. The large heat capacity of heavy fermion materials is due primarily to a contribution by conduction electrons to the total heat capacity, whereas the magnetically affected contributions to the total heat capacity are relatively insignificant. Thus the total heat capacity is substantially unaffected by the strength of the magnetic field, and therefore these materials may be used to absorb heat in high intensity magnetic fields, whereas materials, which derive their high heat capacity primarily from low temperature magnetic ordering transitions, have diminished heat capacities when subjected to high intensity magnetic fields.

DETAILED DESCRIPTION OF THE PREFERRED EMBODIMENTS

Figure 1:
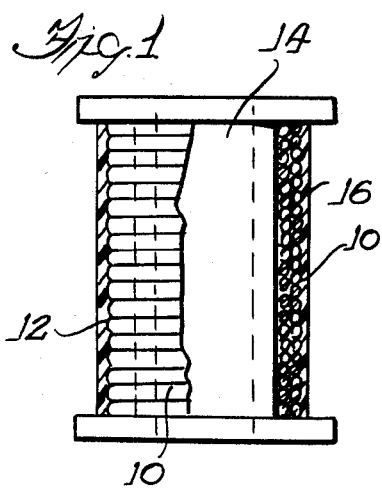
FIG. 1 is an elevation view, partially cut away, of a superconducting coil.

In accordance with the invention, a novel use is made of materials, known as "heavy fermion superconductors" or "strongly interacting Fermi liquids", hereafter to be known as heavy fermion materials (HFM) for heat absorption at temperatures approaching 0° K. whereat certain materials may become superconducting and particularly at temperatures below about 10° K. More particularly heavy fermion materials are used for thermally stabilizing superconducting windings.

Heavy fermion materials are binary ($A_xB_y$), ternary ($A_xB_yC_z$), pseudobinary ($A_{1-x}B_xC_y$) or pseudoternary ($A_{1-x}B_xC_yD_z$) compounds which all include either a rare earth element or an actinide element. Cerium is the most common rare earth element in these compounds, and uranium is the most common actinide element. Heavy fermion materials have f electron systems with highly correlated electrons having effective masses about 200 times the bare electron mass at temperatures approaching 0° K., e.g., below about 10° K. These materials have heat capacities below 10° K. which exceed that of copper by two to three orders of magnitude or more, whereby relatively small amounts of these materials can afford very significant thermal stability to a low temperature system. At higher temperatures, the heat capacities of heavy fermion materials drops off due to a reduction in their effective electron masses; however, for purposes of this invention heavy fermion material (HFM) is generally useful up to the temperature whereat the effective electron mass is about 25 times the bare electron mass. That is, for thermally stabilizing a superconducting filament according to the present invention, the heat-absorbing material should have an effective electron mass at least about 25 times and preferably 100 times the bare electron mass at the critical temperature whereat the filament becomes superconducting or if the filament is maintained at a lower temperature, the heat-absorbing material should have such an elevated effective electron mass at the maintenance temperature.

Heavy fermion materials have been of recent interest in that some become superconducting at extremely low temperatures, e.g., below about 1° K., and as superconductors have unique properties. However, the present invention is not concerned with the superconducting properties of heavy fermion materials but rather with another unique property of these materials, that is, the extremely high heat capacity of these materials at very low temperatures. This property allows these materials to absorb substantial quantities of heat and thereby efficiently thermally stabilize systems at temperatures below about 25° K. and particularly below about 10° K. In most applications, in fact, the temperature will be between about 1.5° K. and 4.2° K. (the temperature of liquid helium at one atmosphere), a range which is above the temperature where the superconducting heavy fermion materials become superconducting themselves.

Heavy fermion materials not only have unusually high heat capacities at low temperatures, but the high heat capacity is substantially unaffected by the magnetic field. Thus, these materials are useful for absorbing heat in the presence of very large magnetic fields, whereas materials, such as those described in above-mentioned U.S. Pat. No. 4,171,464, which derive their high heat capacities primarily from magnetic ordering transitions, are less effective heat absorbers in high magnetic fields.

In general, the heat capacity C(T) of a magnetic material at low temperatures may be written as $$C(T) = C_e(T) + C_L(T) + C_M(T) + C_{CEF}(T).$$

In this equation, C(T) is the total heat capacity. $C_e(T) = \gamma T$ is the contribution arising from the conduction electrons and $\gamma$ is called the electronic constant or the Summerfeld constant. $C_L(T)$ is due to lattice vibrations or phonons and at low temperatures $C_L(T) = \beta T^3$ where $\beta = 12\pi^{-4}R/5\theta_D^3$ and R is the molar gas constant and $\theta_D$ is the Debye temperature. $C_M(T)$ represents the magnetic contributions to the heat capacity and is large in the vicinity of magnetic ordering transitions. The $C_{CEF}(T)$ term arises from the crystalline electric field due to the ions surrounding the magnetic ion splitting the Hund's rule ground state multiplet of the magnetic ion and causes a "Schottky anomaly". The $C_e(T)$ and $C_L(T)$ terms are relatively independent of applied magnetic fields, whereas the $C_M(T)$ and $C_{CEF}(T)$ terms can be greatly affected by applied magnetic fields. In general, both $\gamma$ and $\beta$(or $\theta_D$) are independent of temperature at low temperatures (25° K. and below).

The materials described in the above-identified U.S. Pat. No. 4,171,464, i.e., gadolinium oxide and gadolinium-aluminum oxide, derive their high heat capacities primarily from the last two components of the heat capacity equation, i.e., $C_M(T)$ and $C_{CEF}(T)$. These components are noticeably reduced in high magnetic fields, and the '464 patent graphically illustrates the difference in heat capacity of $Gd_2O_3$ at 7.2 weight percent in copper at 0 Tesla and at 2.4 Tesla. An advantage which may be realized by the difference in heat capacity at different magnetic fields is that, when used to thermally stabilize superconducting filaments, the $Gd_2O_3$ cools by adiabatic demagnetization of the Gd spins when a decrease in magnetic field strength is "felt" by the material, a phenomenon known as "adiabatic-stability." On the other hand, if the material is not subjected to a decrease in the magnetic field, no such adiabatic cooling will occur and the heat absorption will only be a function of the heat capacity of the material, which heat capacity is depressed in the intense magnetic field. Furthermore, in certain applications, such as superconducting magnets for plasma confinement apparatus, such as fusion reactors, the magnetic field may be about 15 Tesla or more, rather than 2.4 Tesla. Materials which derive their high heat capacity from magnetic ordering transitions have substantially diminished heat capacities at such magnetic field intensities.

The heavy fermion materials used in accordance with the present invention derive their high heat capacities primarily from a very high $C_e(T)$ which is substantially unaffected by magnetic field. The remaining three contributions, i.e., $C_L(T)$, $C_M(T)$ and $C_{CEF}(T)$ are relatively minor contributors to the total heat capacities of heavy fermion materials. Thus, heavy fermion materials are useful for absorbing large quantities of heat, regardless of the magnetic field which they experience. It has been demonstrated that the heat capacity of these materials is substantially unaffected by magnetic fields at temperatures above 0.05° K. Of course, these materials do not provide substantial adiabatic-stability through adiabatic demagnetization, but their extremely high heat capacities act to thermally stabilize material at superconducing temperatures, particularly in the under 10° K. temperature range by absorbing very substantial quantities of heat. Because the heat capacities of heavy fermion materials are substantially unaffected by high magnetic fields, they are particularly suitable for thermally stabilizing superconducting systems where magnetic field intensities reach 1 Tesla and especially in systems where magnetic field intensities reach or exceed 5 Tesla. Preferably a heat-absorbing material is selected for maintaining a filament at a particular superconducing temperature which has a heat capacity at 15 Tesla at least about 90% of its heat capacity at the same temperature in the absence of a magnetic field.

Figure 2:
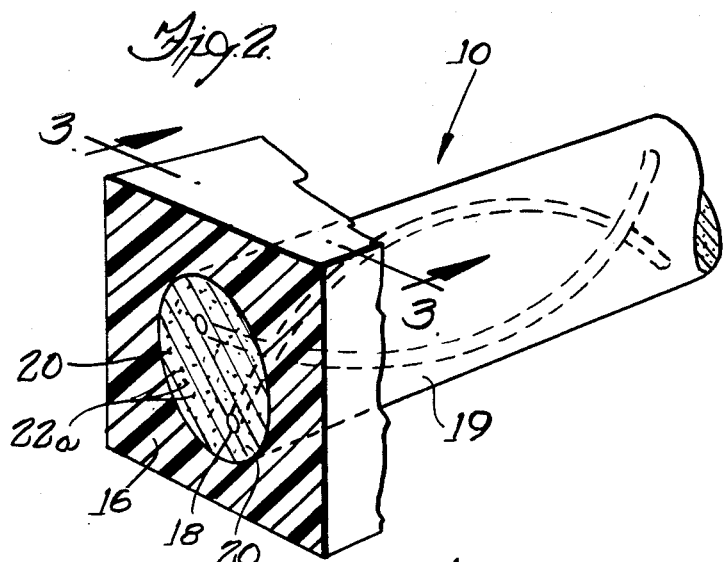
FIG. 2 is an enlarged perspective view of a portion of a superconductor strand embodying various features of the present invention and useful for winding into a coil, such as that shown in FIG. 1.

An important use of heavy fermion materials is thermally stabilizing superconductors 10 (FIG. 1), such as that used in superconducting magnet coils 12. In the illustrated coil 12, a continuous strand of superconductor 10 is wound a plurality of times around a bobbin 14, and the superconductor strand is potted in an insulating material 16, such as epoxy. A conventional superconductor 10 includes a plurality of filaments 18 (FIG. 2) formed of a superconducting material. Superconducting filaments may be formed of material including, but not limited to, NbTi, $Nb_3Sn$, $Nb_3Ge$ and $Nb_3Al$. The filaments 18 are surrounded by a cladding 20 that includes an electrically stabilizing material 19, such as silver, copper or aluminum. The superconductor 10 may contain hundreds of filaments 18 (for ease of illustration only two are shown), but typically the cross-sectional area of the superconductor, including the cladding, is between about 100 and about 10,000 times the total cross-sectional areas of the superconducting filaments themselves. The metal stabilizer 19 is in intimate surrounding contact with the filaments 18 and provides a conduction path or shunt around conduction faults which occur in the superconducting filaments from heat that is produced due to phenomena, such as flux jumps, wire motion or eddy currents. Increases in the temperature of the superconducting filaments 18 to above their superconducting temperature range causes the filaments to become virtually nonconductive. The stabilizer 19 is designed to carry this current around these conduction faults until enough heat has been dissipated to the surrounding coolant, e.g., liquid helium, to again lower the temperature of the superconducting filaments 18 to their superconducting temperature range. If heat cannot be dissipated at a fast enough rate to the surrounding coolant to prevent temperature rises, the generated heat produces an undampened runaway temperature excursion cycle resulting in a major conduction fault.

A conventional superconductor is constructed by forming a billet of the metal stabilizer having a series of holes running along the length of the billet. A series of rods formed from a superconducting material are placed within the holes in the billet such that they extend along the entire length of the billet. The billet and superconducting rods are then extruded down to the size of a small wire in which the superconducting rods form the numerous stabilizer-encased superconducting filaments.

Figure 3:
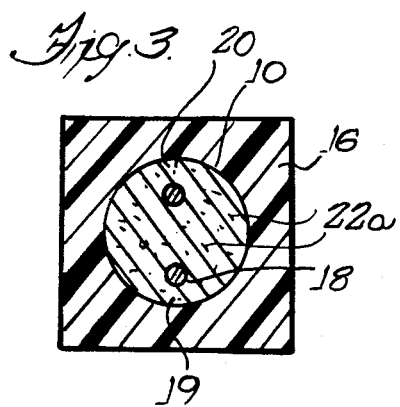
FIG. 3 is a cross-sectional view taken along FIG. 3—3 of FIG. 2.
Figure 4:
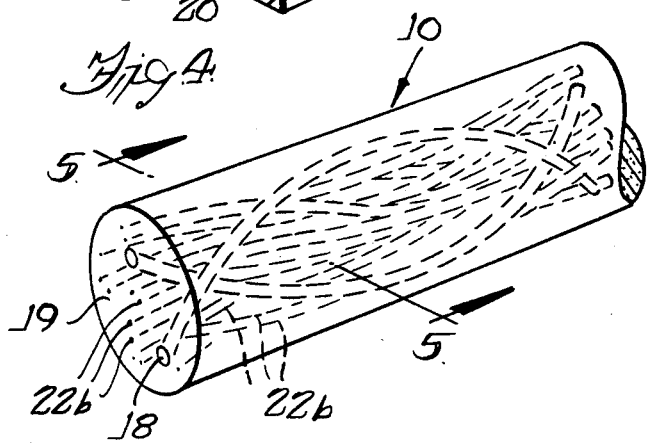
FIG. 4 is a view, similar to that in FIG. 2, showing an alternative embodiment of the present invention.
Figure 5:
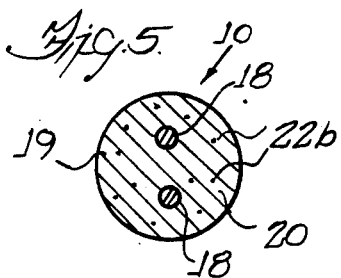
FIG. 5 is a cross-sectional view taken along FIG. 5—5 of FIG. 4.

In accordance with one aspect of the invention, cladding 20 for one or more superconducting filaments 18 comprises heavy fermion material 22a, 22b that is incorporated in insolubilized form into the metal 19 that electrically stabilizes the superconductor. In one form, as shown in FIGS. 4 and 5, the heavy fermion material is in the form of filaments 22b running through the superconductor 10 parallel to the superconducting filaments 18. In another form, FIGS. 2 and 3, the heavy fermion material is fine particulates 22a dispersed in insolubilized form throughout the stabilizing material 19. If in the form of filaments 22b, rods formed of heavy fermion material are inserted as additional rods in additional holes through the billet of stabilizing material and are coextruded with the superconducting rods and stabilizer. Alternatively, particulates 22a are dispersed in insolubilized form with the stabilizer 19 during the formation of the billet. In a composite cladding 20, heavy fermion material may comprise between about 0.1 percent and about 20 percent by weight of the cladding, but more preferably between about 1 and about 10 percent by weight of the cladding. If the heavy fermion material is incorporated into the stabilizer in filament form 22b, the filaments are typically between about 0.1 and about 10 microns in diameter. If the heavy fermion material is dispersed into the stabilizer in particulate form 22a, the particulates are generally between about 100 and about 400 U.S. Standard Mesh.

The heavy fermion material within the stabilizer functions as a heat sink, absorbing excess heat which may be produced during normalizations of portions of the superconducting circuit. The specific heat coefficient, $\gamma$, attributable to conducting electrons of heavy fermion material, ranges from about 50 to 2000 mJ/mole-$K^2$ at 0° K. This is from about two orders of magnitude to upwards of three orders of magnitude above copper, which has a specific heat coefficient, $\gamma$, of 0.69 mJ/mole-$K^2$. Thus, if even the least efficient of these materials is incorporated in a copper stabilizer to 1 percent by mole fraction of the cladding, the heat capacity of the copper-heavy fermion material composite is doubled relative to the copper by itself. Further stabilization is provided by the use of these heavy fermion materials having even higher heat capacities.

$\gamma$ values for several useful heavy fermion materials compositions at 0° K. are given in the table below.

| MATERIAL | $\gamma$ (0° K.) (mJ/mole-$K^2$) |
|---|---|
| $CeAl_3$ | 1600 |
| $CeCu_2Si_2$ | 1400 |
| $UBe_{13}$ | 1100 |
| $U_6Fe$ | 150 |
| $CeCu_6$ | 1600 |
| $U_2Zn_{17}$ | 395–1070 |

Although $\gamma$ decreases slightly with increasing temperature (T) due to progressive decrease in the effective electron mass, all of the heavy fermion materials have extraordinarily high heat capacities through the 0° to 10° K. temperature range, and in some cases these materials provide substantial thermal stabilization up to about 25° K.

For thermally stabilizing a superconducting system, it is preferred to select a heavy fermion material having a $\gamma$ (0° K.) value of at least 150, and more preferably above about 1000. If the material is incorporated in a stabilizer of a superconductor, it is preferred that the amount of heavy fermion material provide the composite cladding 20 (stabilizer 19 plus heavy fermion material 22a or 22b) with a heat capacity that is at least about 10 times that of the stabilizer alone and preferably at least about 100 times that of the stabilizer alone.

Figure 6:
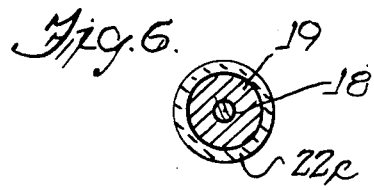
FIG. 6 is a cross-sectional view of a further embodiment of a superconductor according to the present invention.

Illustrated in FIG. 6 is another embodiment of a superconductor in which heavy fermion material thermally stabilizes a superconducing filament 18. In this case, a layer 22c of heavy fermion material surrounds the metal stabilizer 19 in which the filament is embedded. Such a layer of heavy fermion material may be formed, for example, by simultaneously vapor depositing the elements which comprise the binary or ternary compounds on the outer surface of the cladding, or, if the melting temperatures of the heavy fermion material is below that of the stabilizing metal, by casting the heavy fermion material around the metal stabilizer.

Figure 7:
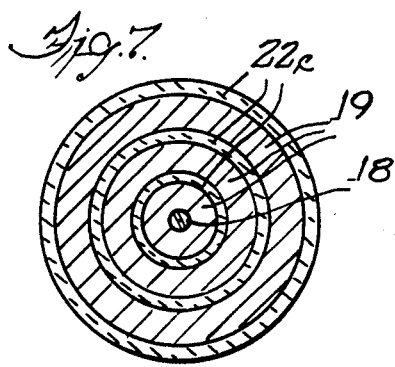
FIG. 7 is a cross-sectional view of a still further embodiment of a superconductor according to the present invention.

A variation of the superconductor of FIG. 6 is illustrated in FIG. 7. In this embodiment a superconducting filament 18 is surrounded by a layer of electrical stabilizing metal 19. Then, successive concentric layers of additional conductive metal 19 and heavy fermion material 22c are formed around the inner cladding by vapor deposition and/or casting. An advantage of providing the heavy fermion material as a layer around the cladding or as concentric layers with the cladding material is that there is believed to be less solubilization of the heavy fermion material into the conductive cladding, whereupon the high conductivity of the cladding metal, which is generally provided in very pure form, is better maintained.

Figure 8:
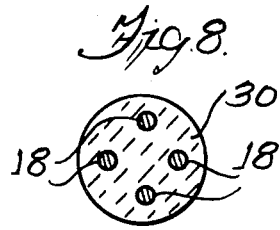
FIG. 8 is a cross-sectional view of a still further embodiment of a superconductor according to the present invention.

Illustrated in FIG. 8 is an embodiment of the invention in which heavy fermion material is used as the actual cladding 30 in which the superconducting filaments 18 are embedded. Certain heavy fermion materials have reasonably high electrical conductivities an thus may shunt portions of the superconducting filaments which normalize. If the heavy fermion material is to be used by itself as the cladding, it should have an electrical conductivity of at least about $10^6 \text{ohm}^{-1}\text{cm}^{-1}$ at 4.2° K. A further requirement of a heavy fermion material which is to stand by itself as cladding for superconducting filaments is that the heavy fermion material be sufficiently ductile to be wound into a coil. Heavy fermion materials suitable as cladding for superconducting filaments include $CeCu_6$, $CeCu_2Si_2$, and $CeAl_3$. Generally heavy fermion 5 materials are less efficient electrical conductors than the pure metals conventionally used as cladding; however, in certain cases, their electrical conductivity is sufficient for shunting purposes. Importantly, the large mass of highly heat absorbing material guards against portions of the superconducting wire normalizing in the first place.

Several advantages of the invention can now be more fully appreciated. The heavy fermion materials all have extraordinarily high heat capacities at superconducting temperatures and therefore are very efficient heat absorbers that are useful for thermally stabilizing superconducting systems. Furthermore, the very large heat capacities can be attributed primarily to a component of heat capacity which is substantially unaffected by magnetic intensity, thus, these materials are particularly useful in high magnetic fields, i.e., over one Tesla and particularly over five Teslas, where the heat capacities of materials which derive high heat capacities from magnetic ordering transitions have reduced heat capacities. Furthermore, these materials are insoluble in materials, such as silver, copper or aluminum, which are commonly used as stabilizers surrounding superconducting filaments and therefore can be dispersed or otherwise encased in the stabilizer without significantly affecting the electrical properties of the stabilizer.

While the invention has been described in terms of certain preferred embodiments, modifications obvious to one with ordinary skill in the art may be made without departing from the scope of the invention. For example, the heavy fermion material may not be encased in the stabilizer of a superconductor but may be kept in close proximity to the superconductor in a manner that assures sufficiently rapid heat transfer to the heavy fermion material in case of temperature excursions.

Various features of the invention are set forth in the following claims.

What is claimed:

1. A superconductor comprising at least one filament which is superconductive below a critical temperature and a cladding in which said filament is embedded, said cladding being normally conductive below said critical temperature, having a normal conductivity of at least about $10^6 \text{ohm}^{-1}\text{cm}^{-1}$, said cladding comprising between about 0.1 and 100% by weight of a heat-absorbing material having an effective electron mass below said critical temperature that is at least about 25 times the bare electron mass, the balance of said cladding being a normally conductive metal.

2. A superconductor according to claim 1 wherein said heat-absorbing material has an effective electron mass below said critical temperature that is at least about 100 times the bare electron mass.

3. A superconductor according to claim 1 wherein said heat-absorbing material has a $\gamma(0° K.)$ of at least about 50 mJ/mole-$K^2$.

4. A superconductor according to claim 1 wherein said heat-absorbing material has a $\gamma(0° K.)$ value of at least about 150 mJ/mole-$K^2$.

5. A superconductor according to claim 1 wherein said cladding is a composite material comprising a metal having high normal electrical conductivity below said critical temperature and said heat-absorbing material is in intimate contact therewith.

6. A superconductor according to claim 5 wherein said heat-absorbing material comprises between about 0.1 and about 20 percent by weight of said cladding.

7. A superconductor according to claim 5 wherein said metal is selected from the group consisting of silver, aluminum and copper.

8. A superconductor according to claim 5 wherein said heat-absorbing material is in the form of filaments embedded in said metal.

9. A superconductor according to claim 5 wherein said heat-absorbing material is in the form of particulates embedded in said metal.

10. A superconductor according to claim 1 wherein said cladding is formed substantially entirely of said heat-absorbing material.

11. A superconductor according to claim 1 wherein said heat-absorbing material is selected from the group consisting of $CeAl_3$, $CeCu_2Si_2$, $UBe_{13}$, $U_6Fe$, $CeCu_6$ and $UZn_{17}$.

12. A superconducting coil comprising a superconductor according to claim 1 coiled a plurality of times.

13. A method of thermally stabilizing filament which is superconducting below a critical temperature to maintain said filament at a temperature below said critical temperature, the method comprising providing a heat-absorbing material having an effective electron mass at said maintenance temperature of at least about 25 times the actual electron mass and disposing said heat-absorbing material in heat-exchange relationship with said filament.

14. A method according to claim 13 wherein said heat-absorbing material has an effective electron mass at said maintenance temperature of at least about 100 times the bare electron mass.

15. A method according to claim 13 wherein said heat-absorbing material has a $\gamma(0° K.)$ value of at least about 50 mJ/mole-$K^2$.

16. A method according to claim 13 wherein said heat-absorbing material is disposed in intimate surrounding contact with said filament, thereby disposing said heat-absorbing material in heat-exchange relationship with said filament.

17. A method according to claim 13 including disposing a metal having high heat conductivity and high normal electrical conductivity in intimate surrounding contact with said filament and disposing said heat-absorbing material in intimate contact with said metal, thereby disposing said heat-absorbing material in heat-exchange relationship with said filament.

18. A method of developing a magnetic field of intensities of from about 1 Tesla to upwards of about 15 Tesla comprising providing at least one coil of superconductor, which superconductor comprises one or more filaments of material that is superconductive below a critical temperature and a cladding in intimate surrounding contact with said filament which is normally conductive below said critical temperature, said cladding having a normal conductivity of at least about $10^6 ohm^{-1} cm^{-1}$ below said critical temperature, said cladding comprising between about 0.1 and about 100% by weight of a heat-absorbing material having an effective electron mass of at least about 25 times the bare electron mass, the balance being a normally conductive metal, maintaining said coil at a temperature below said critical temperature, and energizing said coil to provide the desired magnetic field.

19. A method according to claim 18 wherein said heat-absorbing material is selected as having a heat capacity at said maintainance temperature at 15 Tesla no less than about 90% of its heat capacity at the same temperature in the absence of a magnetic field.

20. A method according to claim 18 wherein said cladding comprises between about 0.1 and about 20% by weight superconducting material, balance metal.

* * * * *